United States Patent [19]
MacDonald et al.

[11] Patent Number: 5,142,132
[45] Date of Patent: Aug. 25, 1992

[54] ADAPTIVE OPTIC WAFER STEPPER ILLUMINATION SYSTEM

[75] Inventors: Bruce G. MacDonald, San Diego; Robert O. Hunter, Jr., Rancho Santa Fe; Adlai H. Smith, San Diego, all of Calif.

[73] Assignee: Litel Instruments, San Diego, Calif.

[21] Appl. No.: 609,888

[22] Filed: Nov. 5, 1990

[51] Int. Cl.⁵ .............................................. G01J 1/90
[52] U.S. Cl. ................... 250/201.9; 356/121
[58] Field of Search ............ 250/201.9; 356/353, 356/359, 121

[56] References Cited

U.S. PATENT DOCUMENTS 4,865,454  9/1989  Lazzarini et al. ............... 356/359
4,996,412  2/1991  Anafi et al. ..................... 250/201.9

Primary Examiner—David C. Nelms
Assistant Examiner—T. Davenport
Attorney, Agent, or Firm—Brown, Martin, Haller & McClain

[57] ABSTRACT

The illumination system for a semiconductor wafer stepper includes reflective elements within the projection optics of a primary mirror, a secondary mirror, a deformable mirror and a beamsplitter. The beamsplitter directs light reflected from the wafer surface back into an interferometer camera to provide depth of focus and aberration information to a computer which activates and selectively deforms the deformable mirror. Light, input from a mercury arc lamp or laser source, is projected either with an expanded or scanned beam through a reticle which is printed with the pattern to be transferred to the wafer. An interferometer is included to combine light reflected from the wafer surface with a portion of the incoming light at the beamsplitter. The interference pattern formed by that combination is used by the computer to provide realtime manipulation of focus errors, vibration and aberration by deformation of the deformable mirror. The deformable mirror and interferometer system is also applicable to folded beam refractive optic illumination systems and pure refractive optic systems in which a detour is made within the optical train to access the deformable mirror.

25 Claims, 2 Drawing Sheets

ADAPTIVE OPTIC WAFER STEPPER ILLUMINATION SYSTEM

BACKGROUND OF THE INVENTION

Lithography is a key factor in the drive for higher levels of micro-circuit integration. Dynamic RAMs have quadrupled in the level of integration every three years as a result of the reduction in minimum geometries and increases in chip size. As minimum geometries approach 0.5 $\mu$m and below, lithography alternatives include optics, electron beam direct write, X-ray and electron/ion beam proximity technologies. The latter three technologies are still in their infancy relative to optical lithography and still have obstacles to overcome, including decreased throughput, low source brightness and mask complexity, respectively.

Optical lithography continues to be the dominant technology because it is well established and faces no formidable technical barriers to implementing submicron resolution at least as low as 0.35 $\mu$m. The most common lithographic technique for the manufacture of integrated circuits on semiconductor wafers is a step-and-repeat procedure, i.e., a stepper, using reducing optics on the order of 5:1 or 10:1. Steppers offer level-to-level registration precision that is independent of wafer size by separate alignment of each exposure field. Further, the use of reducing optics makes mask production and handling more convenient. Steppers have a disadvantage, however, in that each stepper, although identically designed, is unique as a result of compensations in the complicated optics. As a result, it is often very difficult to align one level to previous levels if the previous levels were exposed using a different stepper.

Improvements in stepper resolution capability have resulted from the design and manufacture of high numerical aperture (N.A.) lenses and the move toward shorter wavelengths. While the majority of current steppers use a mercury lamp's G-line (436 nm) for exposure, the use of I-line (365 nm) exposure is becoming attractive for its shorter wavelength. Further, excimer lasers are being tested as light sources providing wavelengths in the deep UV region, including 248 nm (KrF), 193 nm (ArF) and 153 nm (F$_2$). The limitation in implementation of the shorter wavelengths has been the lenses due to the difficulty in manufacturing high N.A. lenses using deep UV transmissive materials. Most steppers use all refractive optics incorporating many optical elements, on the order of 10-20 lenses for an illumination system, all of which are made from optical quality quartz or fused silica which are subject to chromatic aberration. LiF and CaF$_2$ are used for shorter wavelengths down to 248 nm. With broadband illumination systems, achromatic lenses can be used to correct chromatic variations but materials limitations for deep UV lenses make it extremely difficult to make a practical achromatic lens. For narrowband illumination which can attain deep UV, a chromatic lens may be used but the illumination must be restricted to a very narrow band and frequency stabilized. The narrowing of a source, usually a laser, increases the coherence effects such as formation of interference patterns and standing waves in the photoresist, can result in a significant reduction in irradiance and light uniformity at the wafer, and requires a more costly and technically complicated system.

In most types of refractive optics, lenses can be designed to correct optical aberrations such as spherical aberration, coma, astigmatism and field curvature. However, once a corrected lens is manufactured, its corrections are permanent and cannot be varied to compensate for additional environmentally-induced aberrations. The adaptive optic can be used to provide additional fixed optical aberration correction.

An alternative to refractive optics is an optical system which employs mirrors or a combination of mirrors and refractive optics as the primary imaging elements. The use of reflective optics provides the improvements of greatly reduced optical complexity, relatively broad chromatic correction and the ability to use any of a variety of available light sources including arc lamps and lasers, as long as the mirrors are appropriately coated for reflecting the desired wavelength.

The correction of aberrated wavefronts reflected from a mirrored surface and the addition of controlled distortions to laser signals is known and has particularly been used in ground-based telescopes where aberrations are caused, for example, by thermal gradients, atmospheric turbulence, etc. Selective local deformation of a mirror's reflecting surface may be achieved by the use of piezoelectric activators which are selectively energized by the application of electrical signals thereto to produce mechanical forces upon the rear surface of the mirror. Precise control of the distortions introduced into the mirror's reflecting surface may be achieved by spacing the actuators close to each other and by having the surface area of the mirror influenced by each actuator being kept as small as possible, and by making the structure which carries the reflecting surface as flexible as possible. Such a mirror may consist of a single thin sheet of reflective material as disclosed in U.S. Pat. No. 4,655,563 or may be a segmented mirror as disclosed in U.S. Pat. No. 4,944,580.

It would be desirable to provide an illumination system for a stepper which possesses the ability to compensate for optical aberrations with a deformable mirror as an element of either an entirely reflective system, a combination reflective/refractive optical system or as an add-on to a pure refractive system in which the compensation may be varied realtime as needed. It is to such a system that the present invention is directed.

SUMMARY OF THE INVENTION

It is an advantage of the present invention to provide an illumination system for a semiconductor wafer stepper which uses one or more reflective elements of which at least one element is selectively deformable, permitting correction of optical aberrations and distortion.

It is a further advantage of the present invention to provide an illumination system which is capable of operation in the deep UV region of wavelengths shorter than 200 nm.

It is another advantage of the invention to provide an illumination system which may be used for broadband sources as well as narrowband sources with the use of appropriate reflective and transmissive coatings for the desired wavelength.

Another advantage of the present invention is to provide realtime computer controlled deformation of the deformable mirror, with computer control being dependent upon interferometric feedback from the semiconductor wafer to provide depth of focus and aberration measurement and causing the deformable mirror to deform to a conjugate of the aberration or distortion, or to adjust the image focus on the wafer.

In a first exemplary embodiment, the illumination system for a semiconductor wafer stepper includes reflective elements within the projection optics which are a primary mirror, a secondary mirror, a deformable mirror and a beamsplitter. The beamsplitter directs light reflected from the wafer surface back into an interferometer camera to provide depth of focus and aberration information to a computer which activates and selectively deforms the deformable mirror. Light, input from a mercury arc lamp or laser source, is projected either with an expanded or scanned beam through a reticle which is printed with the pattern to be transferred to the wafer.

The f-number and hence the focal length and field width of the projection optics are determined by selection of the sphericity or asphericity of secondary mirror and the diameter and sphericity or asphericity of the primary mirror. Ideally the optics are selected to provide a wide field of view on the wafer, on the order of 5 cm on a side.

The reflective design of a projection system is subject to small aberrations. The deformable mirror, which is selectively deformed by the application of electrical signals to a plurality of distortive actuators, can assume different shapes and can be deformed to a conjugate of the aberration, thereby cancelling it.

All reflective surfaces are coated with an appropriate thin film to assure optimal reflection at the selected wavelength. While the general concept of reflective optics is applicable to all wavelengths of light, each individual system must be tailored to handle light within a relatively narrow range, as the distortive actuators have limited expansion and will be confined to adjustment within a reasonable range of the selected wavelength.

An interferometer is included to combine light reflected from the wafer surface with a portion of the incoming light at the beamsplitter. The interference pattern formed by that combination is used by the computer to provide realtime manipulation of focus, vibration and aberration.

In a second exemplary embodiment, the illumination system comprises a folded beam refractive projected optic system which includes a deformable mirror and an interferometric feedback system as above for realtime adjustment of the deformable mirror.

Finally, a pure refractive optic projection system can take advantage of the deformable mirror by redirecting the optical train to the deformable mirror then returning the light back to the original path.

The use of adaptive optics in all types of steppers greatly reduces focus error resulting from distortions induced mechanically, thermally and by vibration of the system. This provides a significant advantage in that mechanical distortions are especially difficult to overcome in such systems.

BRIEF DESCRIPTION OF THE DRAWINGS

Understanding of the present invention will be facilitated by consideration of the following detailed description of the preferred embodiments of the present invention, taken in conjunction with the accompanying drawings, in which like reference numerals refer to like parts and in which.

DETAILED DESCRIPTION OF THE PREFERRED EMBODIMENTS

Figure 1:
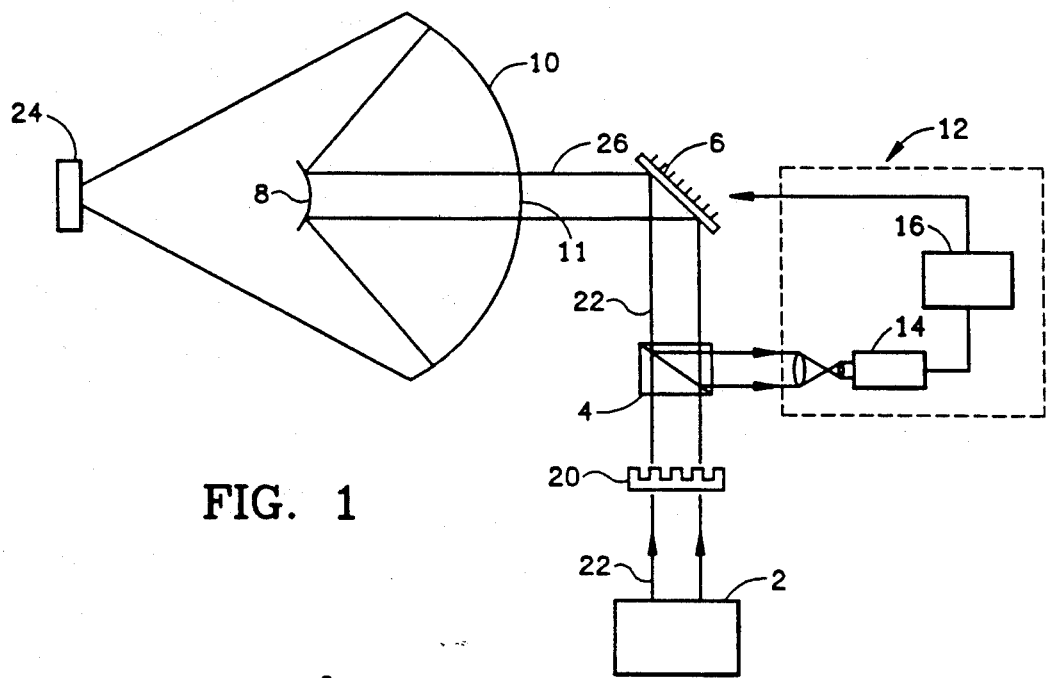
FIG. 1 is a diagrammatic view of a first embodiment of the illumination system of the present invention.

As shown in FIG. 1 the wafer stepper illumination system comprises light source 2, beamsplitter 4, deformable mirror 6, secondary mirror 8 and primary mirror 10. The interferometer system 12 has a detector 14 and a computer 16 which provides signals to control the deformable mirror 6. Patterned reticle 20 is inserted in the light path 22 between the light source 2 and beamsplitter 4 downstream from light source 2. The pattern of reticle 20 is reduced and projected onto wafer 24.

Light source 2 may be either a laser, current applications include excimer lasers with various laser gas mixtures of krypton, fluorine and argon, or an arc lamp. The preferred excimer laser for lithography purposes is KrF, which emits at 248 nm, the preference being mainly due to its relatively long wavelength. Among the arc lamps, mercury vapor is most commonly used either in the G-line (436 nm) or in the I-line (365 nm).

When a laser source is used, the beam will need to be expanded to produce a uniform illumination with a large source size (beam diameter) as seen by the system optics. Methods for expanding the beam include the use of light pipes and diffuser plates, or a scanning mirror. When an arc lamp is used, a parabolic mirror or similar mirror configuration can be used to expand the light source, and light pipes may also be included for uniform transmission.

Reticle 20 is positioned within light path 22 so that it is uniformly illuminated by the light. The reticle 20 is sufficiently stabilized to retain it in a constant location relative to light path 22 and adjustably mounted to facilitate alignment with previous mask levels. The pattern on the reticle 20 is that of a single mask level within the semiconductor process and is a magnification on the order of 4× or greater of the die size of the pattern to be projected onto the wafer 24.

Deformable mirror 6 is disposed within light path 22 to redirect the light carrying the projected pattern along light path 26 toward the secondary mirror 8. Deformable mirror 6 may be in the form of a single sheet reflecting surface as shown in FIG. 2 or a segmented sheet of mirrors as shown in FIG. 3.

Figure 2:
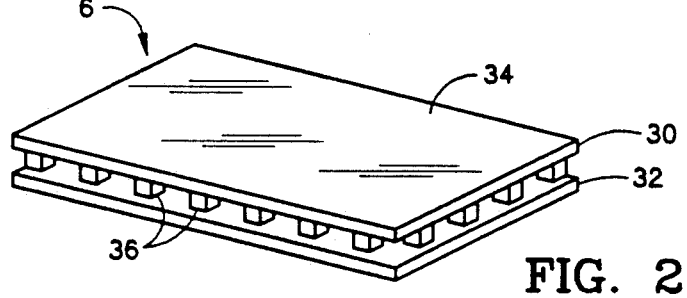
FIG. 2 is a perspective view of a deformable mirror as used in a first embodiment.

In the embodiment shown in FIG. 2, the mirror includes a top sheet 30 and a lower sheet 32. Top sheet 30 has a reflection surface 34 on its outer side, that surface being either planar or curved (concave or convex) as needed to fit the individual system requirements. Reflection surface 3 is preferably coated with a film for minimum absorption and maximum reflection at the chosen wavelength.

Sandwiched between top sheet 30 and base 32 are a plurality of electrodistortive actuators 36, or piezoelectric drivers, which may be selectively operated by applying an electrical signal thereto to elongate each actuator to distort the reflective surface 34. The number and spacing of the actuators 36 used to control deformation of the mirror surface are chosen on the basis of preciseness desired and the type and severity of aberrations to be removed.

Figure 3:
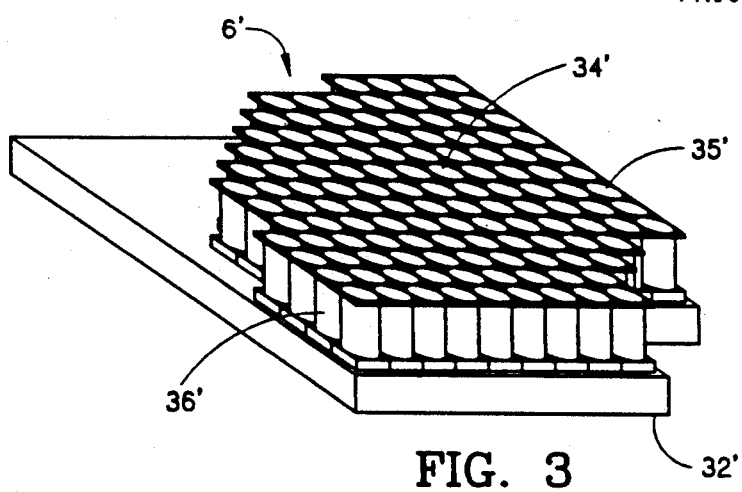
FIG. 3 is a perspective view of a deformable mirror as used in an alternate embodiment.

In the embodiment illustrated in FIG. 3, the deformable mirror 6' consists of an arrangement of actuators 36' as described above mounted on a base 32' with each actuator 36' attached to a mirror segment 35'. The sum of the segments 35' provide a reflective surface 34'. Again, the reflective surface 34' can be planar or curved as needed to meet the system's requirements.

Redirected light path 26 is directed toward secondary mirror and primary mirror 10 which are configured as a Cassegrainian telescope. Primary mirror 10 has an opening 11 at its center through which light path 26 passes to permit access to secondary mirror 8. Secondary mirror 8, which expands light path 26 carrying the pattern image, has a hyperboloidal reflecting surface which is preferably coated with a film optimized to reflect at the chosen wavelength. By using different hyperboloids, different expansions can be achieved, providing flexibility to select the amount of reduction of the reticle pattern onto the wafer 24.

Primary mirror 10 is a large diameter ($\sim 1$ meter) parabolic mirror which focuses the image onto wafer 24. The degree of curvature of the mirror and the diameter are preferably selected to project a pattern with a wide field of view at the focal point to permit imaging of patterns on the order of 5 cm on a side with a single exposure.

Wafer 24 is mounted on a stage with precision translation and rotation control for accurate pattern alignment and for step-and-repeat exposure of the photoresist which has been coated on the wafer 24.

Since the wafer surface is highly polished, a portion of the incident exposure light is reflected back to the primary 10 and the secondary 8 mirrors. The reflected light retraces light path 26 to deformable mirror 6 and to light path 22 to be deflected by beamsplitter 4 toward interferometer system 12. A portion of incident light from source 2 is also deflected by beamsplitter 4 so that the combined light creates an interference fringe pattern representative of the aberration and distortion of the optical wavefronts which transmit the pattern's image onto wafer 24. Lenses 15, internal or external, as shown, to the camera 14, focus the interference fringe pattern onto the imaging elements of camera 14 which convert the fringe pattern into an electrical signal for processing by the computer 16.

Computer 16, using a series of preprogrammed algorithms, determines a correlation between the fringe pattern and aberration and/or distortion of the optical wavefront, similar to the analysis performed for deformable mirror systems used in free space communication systems. After determining the amount and type of distortion, the computer 16 provides a series of signals to drive the actuators 36 of deformable mirror 6, deforming the reflective surface 34 to be the conjugate of the wavefront aberration. Reflection by the deformed surface cancels the aberration in the exposure light or adjusts the focus to project a focused, distortion-free image onto wafer 24.

Continuous sampling by the interferometer system 12 permits realtime correction of aberrations and distortion which are introduced both as a function of the system optics and as environmental fluctuations such as temperature and humidity. Such a system, besides allowing a significant simplification and reduction in the number of optical elements, has a much less stringent requirement for environmental control. An illumination system according to the present invention also alleviates many of the difficulties involved in attempting to use multiple steppers within a production line which, although designed identically, possess individual peculiarities due to lens-to-lens variations. This often requires that a particular production lot be processed through the same stepper at every mask level to achieve alignment to previous levels. The present invention permits practical compensation to overcome individual stepper peculiarities.

Figure 4:
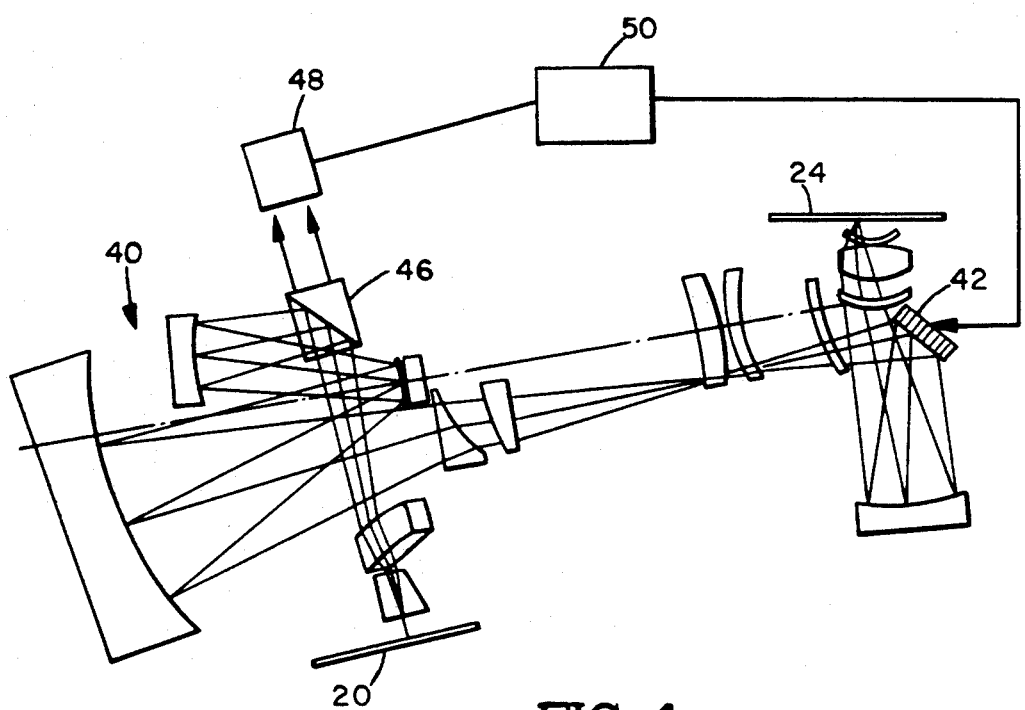
FIG. 4 is a diagrammatic view of a second embodiment.

The aberrations, focus and distortion in a known pure refractive or folded beam refractive optical projection system may similarly be corrected by the inclusion of a deformable mirror and interferometer system in the same manner described in the first embodiment. As shown in FIG. 4, a typical folded catadioptric projection system 40 is illustrated including a deformable mirror 42 and interferometer system consisting of beamsplitter 46, interferometric camera 48 and computer 50. In the embodiment illustrated, the pattern of reticle 20 is reduced through the mirrors lenses of the optical path to reproduce the pattern on wafer 24. Feedback similar to that described above is used to deform mirror 42 to manipulate, focus and compensate for distortion and aberrations. In a pure refractive optic system, not shown, a series of mirrors may be positioned within the optical train to divert the light to a deformable mirror then back to the original path.

Using optical terminology, the Strehl value is a measure of optical system quality where resolution is proportional to $1/\sqrt{Strehl}$ value, with a perfect diffraction-limited optical system having a Strehl value of 1.0. Current projection systems for steppers have Strehl values rarely exceeding 0.2 to 0.3. The inclusion of adaptive optics increases the Strehl value to 0.8 to 0.9, providing superior performance to that available with current steppers.

It will be evident that there are additional embodiments which are not illustrated above but which are clearly within the scope and spirit of the present invention. The above description and drawings are therefore intended to be exemplary only and the scope of the invention is to be limited solely by the appended claims.

We claim:

1. A stepper illumination system for manipulating focus and aberrations in optical wavefronts for projecting an essentially distortion-free reduced pattern of a patterned reticle onto a wafer comprising:

a light source to project incident light through said patterned reticle;

a deformable mirror to redirect light projected through said patterned reticle, said deformable mirror having means for selected deformation;

a secondary mirror to receive redirected light from said deformable mirror and expand and reflect the redirected light; and a primary mirror to receive the redirected light from said secondary mirror and reduce and focus the redirected light onto said wafer so that said reduced pattern is projected onto said wafer, said wafer reflecting a portion of the redirected light;

whereby said focus and said aberations of said optical wavefronts in the redirected light are manipulated by selected deformation of said deformable mirror to substantially eliminate focus and aberration-induced degradation of said reduced pattern as projected onto said wafer.

2. A stepper illumination system as in claim 1 further comprising:

a beamsplitter disposed between said patterned reticle and said deformable mirror to deflect a portion of the incident light and a portion of light reflected by said wafer; and an interferometer system to receive light deflected by said beamsplitter and generate an interference pattern therefrom, said interference pattern being used to determine how said deformable mirror should be deformed to manipulate said focus errors and said aberrations.

3. A stepper illumination system as in claim 1 wherein said deformable mirror comprises a front side having a reflective surface and a backside opposite said front side at which a plurality of distortive actuators are disposed, each of said plurality of distortive actuators being capable of selectively distorting the reflective surface upon application of electrical signals to one or more of said actuators.

4. A stepper illumination system as in claim 2 wherein said interferometer system comprises a detector and a computer, said detector converting said interference pattern into a signal and said computer converting said signal into at least one electrical signal to drive one or more of said actuators.

5. A stepper illumination system as in claim 3 wherein said deformable mirror comprises a thin sheet of glass.

6. A stepper illumination system as in claim 3 wherein said deformable mirror comprises a plurality of segmented mirror elements with one segmented mirror element being attached to each of said plurality of actuators so that an essentially continuous mirror is formed.

7. A stepper illumination system as in claim 1 wherein said deformable mirror, said secondary mirror and said primary mirror are coated on their respective reflective surfaces with a coating to optimize reflection of light within a range of a selected exposure wavelength.

8. A stepper illumination system as in claim 1 wherein a combination comprising said secondary mirror and said primary mirror reduces said reduced pattern at least four times from said patterned reticle.

9. A stepper illumination system as in claim 1 wherein said reduced pattern has a field size greater than or equal to 4 cm.

10. A stepper illumination system as in claim 1 wherein said light source is a laser which emits light in the deep ultraviolet (DUV) spectrum.

11. A stepper illumination system as in claim 1 wherein said light source is an arc lamp which emits light in the ultraviolet spectrum.

12. A stepper illuminating system for manipulating focus and aberrations in optical wavefronts and for projecting a pattern of a reticle onto a wafer comprising:
 a light source to project light through said reticle;
 a beamsplitter disposed between said patterned reticle and said deformable mirror to reflect a portion of the incident light and a portion of light reflected by said wafer;
 a deformable mirror to redirect said light projected through said reticle, said deformable mirror having a reflective surface on a front side and a plurality of distortive actuators on a backside, each of said plurality of distortive actuators being capable of selectively distorting the reflective surface upon application of electrical signals to at least one of said actuators;

a secondary mirror to receive the redirected light from said deformable mirror and expand and reflect the redirect light; and
 a primary mirror to receive the redirected light from said secondary mirror and reduce and focus the redirected light onto said wafer so that a reduction of said pattern of said reticle is projected onto said wafer;
 whereby said focus and said aberrations of said optical wavefronts in the redirected light are manipulated by selected deformation of said deformable mirror.

13. A stepper illumination system as in claim 12 wherein said deformable mirror comprises a thin sheet of glass.

14. A stepper illumination system as in claim 12 wherein said deformable mirror comprises a plurality of segmented mirror elements with one segmented mirror element being attached to each of said plurality of actuators so that an essentially continuous mirror is formed.

15. A stepper illumination system as in claim 12 wherein said deformable mirror, said secondary mirror and said primary mirror are coated on their respective reflective surfaces with a coating to optimize reflection of light within a range of a selected exposure wavelength.

16. A stepper illumination system as in claim 12 wherein said light source is a laser which emits light in the deep ultraviolet (DUV) spectrum.

17. A stepper illumination system as in claim 12 wherein said light source is an arc lamp which emits light in the ultraviolet spectrum.

18. An illumination system for manipulating aberrations in optical wavefronts and for projecting modulated light onto a surface comprising:
 a means for projecting light through a light modulating apparatus;
 a deformable mirror to redirect said modulated light, said deformable mirror having a plurality of distortive actuators for selectively distorting said deformable mirror upon application of electrical signals to one or more of said actuators;
 a plurality of optical elements comprising means for reducing and projecting said modulated light onto said surface, said surface reflecting a portion of said modulated light, whereby said aberrations of said optical wavefronts in said modulated light are manipulated by selective deformation of said deformable mirror.

19. An illumination system as in claim 1 further comprising:
 a means for deflecting a portion of the projected light and a portion of light reflected from said surface;
 a means for receiving light from said deflecting means and generating an interference pattern therefrom; and
 a means for determining how said deformable mirror should be deformed to manipulate said aberrations.

20. A method for manipulating focus and aberrations in optical wavefronts in a stepper illumination system for projecting a reduced pattern of a patterned reticle onto a wafer which comprises:
 selecting a light source which emits light within the deep ultraviolet spectrum;
 projecting light from said light source through said patterned reticle;

redirecting the light projected through said reticle with a deformable mirror toward a secondary mirror;

expanding and reflecting toward a primary mirror the redirected light with said secondary mirror;

focusing the redirected light onto said wafer with said primary mirror whereby said reduced pattern is projected onto said wafer;

reflecting a portion of the redirected light from said wafer;

using said reflected portion to determine focusing errors and aberrations; and selectively deforming said deformable mirror to manipulate said focus and aberrations.

21. A method as in claim 20 further comprising:

directing a portion of the light projected through said reticle toward a detector;

combining said portion of projected light with said reflected portion to form an interference pattern corresponding to said focusing errors and aberrations;

detecting said interference pattern; and converting said interference pattern into an electrical signal for controlling said deformable mirror.

22. A method as in claim 20 further comprising coating said deformable mirror, said secondary mirror and said primary mirror with a coating to optimize reflection of light within a range of a selected exposure wavelength within the deep ultraviolet spectrum.

23. A method as in claim 20 wherein the step of selecting a light source comprises selecting a laser.

24. A method as in claim 20 wherein the step of selecting a light source comprises selecting an arc lamp.

25. A method for realtime manipulation of focus and aberrations in optical wavefronts in a stepper illumination system for projecting a pattern from a patterned reticle onto a wafer which comprises:

inserting a deformable mirror within a light path of said illumination system downstream from said patterned reticle;

inserting a beamsplitter between said patterned reticle and said deformable mirror for diverting a portion of incoming light and a portion of light reflected from said wafer toward a detector;

generating an interference pattern corresponding to said focusing errors and said aberrations by combining both said portions of light;

detecting said interference pattern; and converting said interference pattern into an electrical signal for controlling said deformable mirror.

* * * * *